United States Patent [19]

Freeman

[11] 4,443,303

[45] * Apr. 17, 1984

[54] METHOD OF MAKING COLD SHIELD AND ANTIREFLECTOR FOR INFRARED DETECTOR ARRAY AND PRODUCT THEREOF

[75] Inventor: W. Larry Freeman, Woodbridge, Va.

[73] Assignee: The United States of America as represented by the Secretary of the Army, Washington, D.C.

[*] Notice: The portion of the term of this patent subsequent to Jul. 5, 2000 has been disclaimed.

[21] Appl. No.: 489,631

[22] Filed: Apr. 28, 1983

Related U.S. Application Data

[63] Continuation-in-part of Ser. No. 426,429, Sep. 29, 1982, abandoned.

[51] Int. Cl.³ .......................... C25D 5/02; C25D 7/12; G01J 1/44
[52] U.S. Cl. .................................... 204/15; 204/38 B; 250/338
[58] Field of Search ..................... 204/15, 35 R, 38 B; 250/338

[56] References Cited

U.S. PATENT DOCUMENTS

| | | | |
|---|---|---|---|
| 3,963,926 | 6/1976 | Borrello | 250/338 |
| 4,062,107 | 12/1977 | Blackman et al. | 29/628 |
| 4,366,229 | 12/1982 | Freeman | 430/312 |
| 4,391,678 | 7/1983 | Freeman | 204/15 |

*Primary Examiner*—Howard S. Williams
*Assistant Examiner*—T. L. Williams
*Attorney, Agent, or Firm*—Anthony T. Lane; Milton W. Lee; Aubrey J. Dunn

[57] ABSTRACT

An infrared detector array and its associated conductors on a substrate are covered with an insulating antireflection layer. In one embodiment, a thin metal layer is sputtered or evaporated on this layer and the metal is masked and etched to uncover desired portions of the insulating layer over the detectors and the conductors. The mask is removed and a thick metal layer is electroplated onto the thin metal layer. An alternate embodiment applies the thick metal layer on an unetched thin metal layer, and both layers are etched through a mask to uncover the desired portions of the insulating layer. The mask is stripped and the final steps (both embodiments) include masking and etching to remove the nonmetallized insulating layer on the conductors.

4 Claims, 1 Drawing Figure

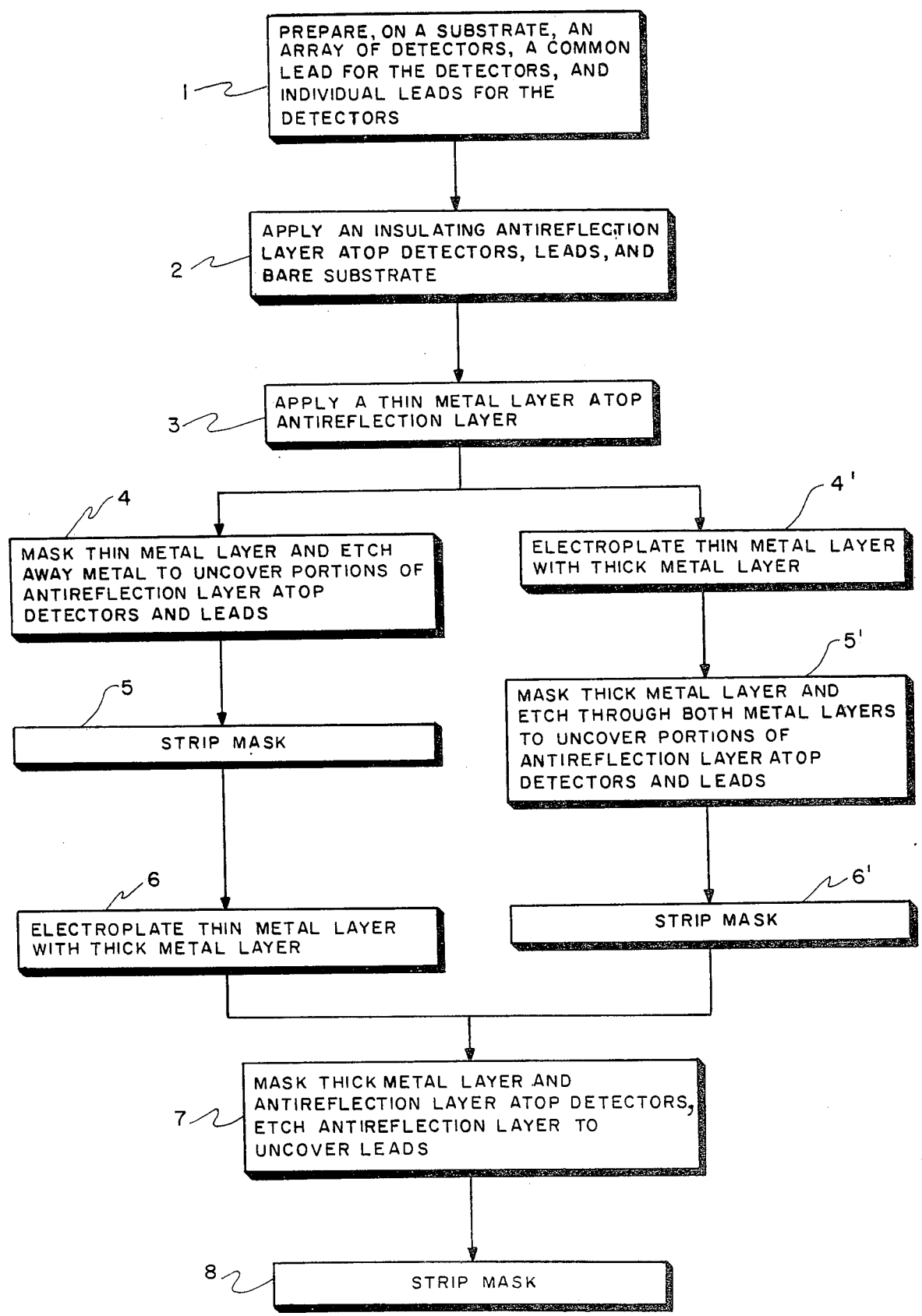

METHOD OF MAKING COLD SHIELD AND ANTIREFLECTOR FOR INFRARED DETECTOR ARRAY AND PRODUCT THEREOF

The invention described herein may be manufactured, used, and licensed by the U.S. Government for governmental purposes without the payment of any royalties thereon.

CROSS REFERENCE TO RELATED APPLICATION

This invention is a continuation-in-part of Ser. No. 426,429, filed Sept. 29, 1982, now abandoned.

BACKGROUND OF THE INVENTION

This invention is in the field of cold shields for infrared detector arrays. Such arrays consist of infrared detectors grown or otherwise formed or applied to an insulating or semiconductor substrate, and have the various bias and/or read-out electrical conductors on the substrate and connected to the detectors. The arrays may be either one or two dimensional, i.e. they may consist of a single line of detectors, or multiple parallel lines. In either event, the array is cryogenically cooled and infrared radiation from some desired field-of-view is directed thereon. In order to reduce the effects of radiations from sources outside the field-of-view and to help establish and maintain a substantially uniform detector temperature, a cold shield may be used. The cold shields currently used are perforated plates of insulation or of metal-coated insulation which are glued by hand onto the substrate holding the detector array. Since the detector arrays now commonly used are small, it is necessary to perform the gluing operation under a microscope. The operation has several disadvantages, including the difficulty of applying glue lines micrometers in length and width. Moreover, it requires skilled workers to apply the shields, and only one can be applied at a time. Also, the shields require a separate processing line for their fabrication from the line used to make the arrays. After a cold shield is applied, by whatever method, it is then usual to apply an antireflection layer to the detectors. This is another disadvantage because it requires a step which the instant invention obviates. All of these disadvantages combine to yield a cold shield and antireflector which is very expensive to produce, compared to the combination cold shield and antireflector as invented by the instant inventor. Specifically, the instant invention includes steps compatible with the normal steps of making the array, requires no skilled hand labor, does not require separate facilities to produce the combination, and is thus much cheaper and easier to make than the prior art methods.

SUMMARY OF THE INVENTION

The invention is a method of making a cold shield and antireflector for an infrared detector array. The method (in one embodiment) includes the steps of covering the array and its associated substrate and electrical conductors with an insulating antireflection layer. This layer in turn is coated with a thin metal layer; this metal layer is coated with a top layer of photoresist. This photoresist is exposed and developed to make holes therethrough uncovering the metal over the detectors and regions of the electrical conductors. An etchant is used to remove the uncovered metal and to thus uncover the insulating layer over the detectors and conducts. The photoresist is stripped, the thin metal remaining is electroplated with a thick metal layer. All of the thick metal and the antireflection layer over the detectors are covered by a mask, and the antireflection layer is etched away over the electrical conductors not covered by the mask. In another embodiment of the invention, the thick metal layer is applied to the thin metal layer before the top photoresist is applied. This top photoresist is applied on the thick metal layer, and is exposed and developed to uncover metal over the detectors and regions of the conductors. The uncovered metal (both layers) is etched away and uncovers the initially applied antireflection layer. The photoresist is stripped and the antireflection layer is masked and etched as described above.

BRIEF DESCRIPTION OF THE DRAWING

The single drawing FIGURE is a flow chart of the invention.

DESCRIPTION OF PREFERRED EMBODIMENTS

This description may be best understood when taken in conjunction with the drawing. Step 1 is the usual method of preparing a photodetector array and is not, per se, a part of the inventive method. The form that this array may take is shown in my U.S. Pat. No. 4,366,229, issued Dec. 28, 1982. The detector array, all the connecting leads, and the remainder of the substrate side not covered by the detectors and leads are coated in step 2 with an antireflection layer; this layer is an electrical insulator on the order of 5 microns thick. In step 3, a thin metal layer on the order of 2000 Å thickness is applied by sputtering or evaporation on the insulating layer. After step 3, there are two alternate paths which one may choose. The left path on the drawing continues with step 4 wherein the metal layer is masked and etched through the mask to uncover portions of the antireflection layer. It should be understood that to form the mask entails coating the metal with a top layer of photoresist, exposing this layer through a proper pattern, and developing the layer to form a mask with holes through which to etch away uncovered metal. After the mask is removed in step 5, the remaining thin metal is electroplated in step 6 with a thick metal layer on the order of 3 mils thick. In step 7, the antireflection layer over the detectors and the thick metal layer are masked. The portions of the conductive leads are exposed by etching away (through the mask) the antireflection layer over them. It should be obvious to ones skilled in the art that various steps of washing and drying may be necessary between various steps, but specific recitations of these obvious steps are omitted herein. Particular metals which may be used include, but are not limited to: nickel, gold, indium, with an appropriate etchant for the particular metal. A typical material for an electrically insulating antireflection is zinc sulfide, with hydrochloric acid as an etchant.

The alternate embodiment of the invention begins in step 4' wherein the thin metal layer of step 3 is electroplated by a thick metal layer the same thickness as the layer of step 6. In step 5', the thick metal layer is masked (similar to step 4) and both metal layers are etched to expose portions of the antireflection layer atop the detectors and the conductive leads. When either step 6 or 6' is completed, step 7 and 8 are performed and the array is ready for bonding lead connections, etc. in the usual manner.

Althrough specific embodiments with specific sequences of steps have been described, it should be understood that variations are possible within the scope of the embodiments.

I claim:

1. A method of applying a cold shield to an array of photodetectors and their associated conductors on one side of a substrate, including the steps of:
    (a) coating said photodetectors, said conductors, and said one side of said substrate with an electrically insulating antireflection layer;
    (b) applying a thin metal layer atop said layer;
    (c) masking said metal layer and etching the metal layer to uncover portions of the antireflection layer atop the photodetectors and atop portions of the conductors;
    (d) stripping the mask;
    (e) electroplating a thick metal layer atop said thin metal layers;
    (f) masking said thick metal layer and etching to remove the antireflection layer from atop said portions of said conductors and;
    (g) stripping the mask.

2. A method of applying a cold shield to an array of photodetectors and their associated conductors on one side of a substrate, including the steps of:
    (a) coating said photodetectors, said conductors, and said one side of said substrate with an electrically insulating antireflection layer;
    (b) applying a thin metal layer atop said layer;
    (c) electroplating a thick metal layer atop said thin metal layer;
    (d) masking said thick metal layer and etching through both metal layers to uncover portions of antireflection layer atop the photodetectors, and portions of the conductors;
    (e) stripping the mask;
    (f) masking said thick metal layer and etching to remove the antireflection layer from atop said portions of said conductors and;
    (g) stripping the mask.

3. A product consisting of an array of photoconductors and their associated conductors on one side of a substrate, with said array and said conductors covered by a cold shield, the product being produced by the method including the steps of:
    (a) coating said photodetectors, said conductors, and said one side of said substrate with an electrically insulating antireflection layer;
    (b) applying a thin metal layer atop said layer;
    (c) masking said metal layer and etching the metal layer to uncover portions of the antireflection layer atop the photodetectors and atop portions of the conductors;
    (d) stripping the mask;
    (e) electroplating a thick metal layer atop said thin metal layer;
    (f) masking said thick metal layer and etching to remove the antireflection layer from atop said portions of said conductors and;
    (g) stripping the mask.

4. A product consisting of an array of photoconductors and their associated conductors on one side of a substrate, with said array and said conductors covered by a cold shield, the product being produced by the method including the steps of:
    (a) coating said photodetectors, said conductors, and said one side of said substrate with an electrically insulating antireflection layer;
    (b) applying a thin metal layer atop said layer;
    (c) electroplating a thick metal layer atop said thin metal layer;
    (d) masking said thick metal layer and etching through both metal layers to uncover portions of antireflection layer atop the photodetectors, and portions of the conductors;
    (e) stripping the mask;
    (f) masking said thick metal layer and etching to remove the antireflection layer from atop said portions of said conductors and;
    (g) stripping the mask.

* * * * *